United States Patent
Loubet et al.

(10) Patent No.: US 11,575,003 B2
(45) Date of Patent: Feb. 7, 2023

(54) CREATION OF STRESS IN THE CHANNEL OF A NANOSHEET TRANSISTOR

(71) Applicants: International Business Machines Corporation, Armonk, NY (US); COMMISSARIAT A L'ENERGIE ATOMIQUE ET AUX ENERGIES ALTERNATIVES, Paris (FR)

(72) Inventors: Nicolas Loubet, Guilderland, NY (US); Tenko Yamashita, Schenectady, NY (US); Guillaume Audoit, Bourgoin Jallieu (FR); Nicolas Bernier, Le Sappey en Chartreuse (FR); Remi Coquand, Les marches (FR); Shay Reboh, Labuisse (FR)

(73) Assignees: International Business Machines Corporation, Armonk, NY (US); Commissariat A L'Energie Atomique Et Aux Energies Alternatives

(*) Notice: Subject to any disclaimer, the term of this patent is extended or adjusted under 35 U.S.C. 154(b) by 94 days.

(21) Appl. No.: 17/240,002

(22) Filed: Apr. 26, 2021

(65) Prior Publication Data
US 2021/0257450 A1     Aug. 19, 2021

Related U.S. Application Data

(62) Division of application No. 16/515,143, filed on Jul. 18, 2019, now Pat. No. 11,049,933.

(51) Int. Cl.
*H01L 29/06* (2006.01)
*H01L 29/78* (2006.01)
*H01L 29/417* (2006.01)

(52) U.S. Cl.
CPC .... *H01L 29/0665* (2013.01); *H01L 29/41791* (2013.01); *H01L 29/785* (2013.01); *H01L 29/7848* (2013.01); *H01L 2029/7858* (2013.01)

(58) Field of Classification Search
CPC .......... H01L 29/0665; H01L 29/41791; H01L 29/7848; H01L 29/785; H01L 2029/7858
(Continued)

(56) References Cited

U.S. PATENT DOCUMENTS 9,240,484 B2   1/2016   Kelly et al.
9,331,148 B1   5/2016   Doris et al.
(Continued)

OTHER PUBLICATIONS

List of IBM Patents or Patent Applications Treated as Related; Date Filed: Apr. 26, 2021, 2 pages.

*Primary Examiner* — Dzung Tran
(74) *Attorney, Agent, or Firm* — Cantor Colburn LLP; Samuel Waldbaum

(57) ABSTRACT

Provided are embodiments for a semiconductor device. The semiconductor device includes a nanosheet stack comprising one or more layers, wherein the one or more layers are induced with strain from a modified sacrificial gate. The semiconductor device also includes one or more merged S/D regions formed on exposed portions of the nanosheet stack, wherein the one or more merged S/D regions fix the strain of the one or more layers, and a conductive gate formed over the nanosheet stack, wherein the conductive gate replaces a modified sacrificial gate without impacting the strain induced in the one or more layers. Also provided are embodiments for a method for creating stress in the channel of a nanosheet transistor.

6 Claims, 11 Drawing Sheets

(58) Field of Classification Search
USPC .......................................................... 257/365
See application file for complete search history.

(56) References Cited

U.S. PATENT DOCUMENTS

| | | |
|---|---|---|
| 9,711,414 B2 | 7/2017 | Hatcher et al. |
| 9,761,722 B1 | 9/2017 | Jagannathan et al. |
| 9,893,187 B2 | 2/2018 | Kittl et al. |
| 9,911,834 B2 | 3/2018 | Cheng et al. |
| 10,008,583 B1 | 6/2018 | Rodder et al. |
| 10,020,398 B1 | 7/2018 | Cheng et al. |
| 10,263,077 B1 * | 4/2019 | Reboh ............... H01L 21/02433 |
| 2013/0248948 A1 | 9/2013 | Ma et al. |
| 2015/0364603 A1 | 12/2015 | Cheng et al. |
| 2016/0118472 A1 | 4/2016 | Qi |
| 2017/0110554 A1 | 4/2017 | Tak et al. |
| 2018/0158952 A1 | 6/2018 | Balakrishnan et al. |
| 2018/0301557 A1 * | 10/2018 | Cheng ................... B82Y 10/00 |
| 2019/0067447 A1 * | 2/2019 | Zhou ................... H01L 29/0673 |
| 2021/0020743 A1 | 1/2021 | Loubet et al. |

* cited by examiner

CREATION OF STRESS IN THE CHANNEL OF A NANOSHEET TRANSISTOR

BACKGROUND

The present invention generally relates to semiconductors and more specifically to creation of stress in the channel of a nanosheet transistor.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region, and the gate controls the current in the channel. The gate voltage controls whether the path from drain to source is an open circuit ("off") or a resistive path ("on").

In recent years, research has been devoted to the development of nonplanar transistor architectures. For example, nanosheet FETs provide increased device density and some increased performance over lateral devices. In nanosheet FETs, in contrast to conventional FETs, the channel is formed from spaced-apart vertically stack nanosheets, and the gate stack wraps around the full perimeter of each nanosheet, thereby enabling fuller depletion in the channel region and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

Embodiments of the present invention are directed to a method for creating stress in the channel of a nanosheet transistor. A non-limiting example of the method includes forming a nanosheet stack on a substrate, wherein the nanosheet stack including one or more layers, forming a sacrificial gate over the nanosheet stack, and modifying the sacrificial gate over the nanosheet stack, wherein the modification causes a phase transition to induce strain in the one or more layers. The method also includes exposing the one or more layers of the nanosheet stack, fixing the strain in the one or more layers by forming a merging source/drain (S/D) region on the exposed portions of the nanosheet stack, and replacing the sacrificial gate with a conductive gate while maintaining the induced strain in the one or more layers.

Embodiments of the present invention are directed to a semiconductor device. The semiconductor device includes a nanosheet stack including one or more layers, wherein the one or more layers are induced with strain from a modified sacrificial gate. The semiconductor device includes one or more merged S/D regions formed on exposed portions of the nanosheet stack, wherein the one or more merged S/D regions fix the strain of the one or more layers, and a conductive gate formed over the nanosheet stack, wherein the conductive gate replaces a modified sacrificial gate without impacting the strain induced in the one or more layers.

Embodiments of the present invention are directed to a method for creating stress in the channel of a nanosheet transistor. The method includes forming a plurality of nanosheet stacks on a substrate, wherein the nanosheet stack includes one or more layers. The method also includes forming a sacrificial gate over the plurality of nanosheet stacks, and modifying the sacrificial gate over the plurality of nanosheet stacks, wherein the modification causes a phase transition to induce strain in the one or more layers, exposing the one or more layers of the plurality of nanosheet stacks, fixing the strain in the one or more layers by forming merging source/drain (S/D) regions on the exposed portions of the plurality of nanosheet stacks, and replacing the sacrificial gate with a conductive gate while maintaining the induced strain in the one or more layers.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
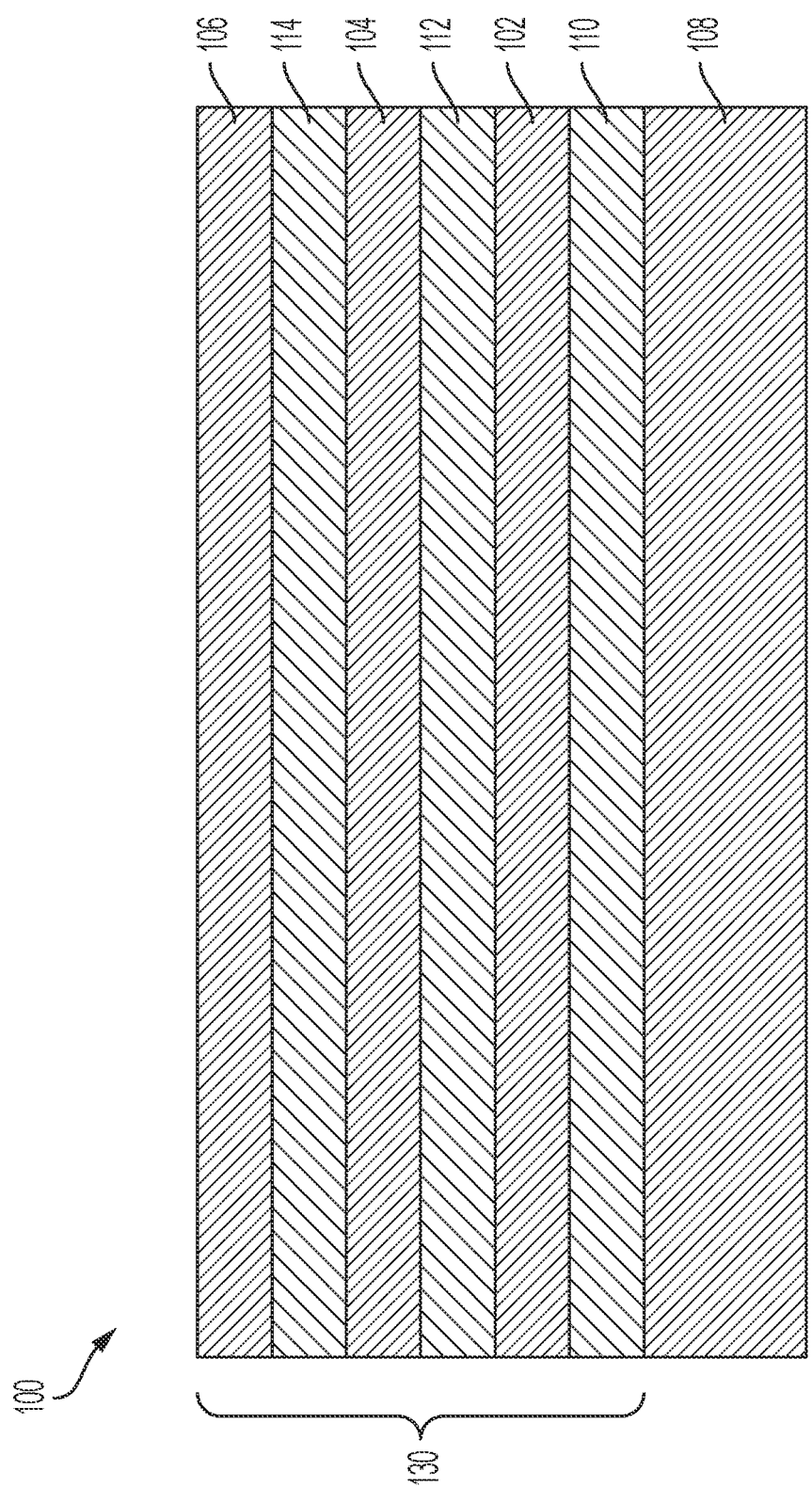
FIG. 1 depicts a cross-sectional view of a structure having semiconductor layers formed on a substrate during an intermediate operation of a method of fabricating a semiconductor device according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although this description includes a detailed description of an exemplary n-type GAA nanosheet FET architecture having silicon channel nanosheets and silicon germanium sacrificial nanosheets, implementation of the teachings recited herein are not limited to the particular FET architecture described herein. Rather, embodiments of the present invention are capable of being implemented in conjunction with any other type of FET device now known or later developed, including, for example, p-type GAA nanosheet FET architectures having silicon germanium channel nanosheets and silicon sacrificial nanosheets.

Turning now to an overview of technologies that are more specifically relevant to aspects of the invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are silicon (Si) and the sacrificial nanosheets are silicon germanium (SiGe). For p-type FETs, the channel nanosheets are SiGe and the sacrificial nanosheets are Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si. Mechanical strain improves mobility. In advanced transistors it is difficult to obtain strain in the channel due to the limit area available in the device and in scenarios where the strain is induced in the channel, subsequent processing of the transistor relaxes the desired strain in the channel region.

Turning now to an overview of the aspects of the invention, one or more embodiments of the invention address the above-described shortcomings of the prior art by providing a semiconductor structure and method that uses the principle of "fixing" the strain provided by the dummy gate into the channel regions of a transistor. In embodiments of the invention a phase transition in the dummy gate material is used to generate stress in the channel region. The stress is then fixed with the source and drain materials, so that the dummy gate can be replaced by a final gate without substantially losing the generated stress in the channel.

The phase transition of the sacrificial gate material causes strain to be applied to the semiconducting material which induces a change in the crystalline lattice of the channel layers and therefore its band structure, which will result in a change in the mobility of charge carriers in the material. In one or more embodiments of the invention, a thermal annealing process can be applied to the sacrificial gate material at moderate temperatures, (e.g. from 300° C. to 900° C.) to enable contraction of the crystalline structure. The mobility of electrons is increased or reduced by a tensile or compression stress respectively in the semiconducting material in which they transit, while the mobility of holes will be increased or reduced when the semiconductor is in compression or in tension, respectively. When applying strain in the channel regions volume modification is favorable for pMOS where compressive material under the dummy gate is obtained to increase the hole mobility within the device, and a volume modification is favorable for nMOS where tensile material under the gate is obtained to increase the electron mobility within the device.

The above-described aspects of the invention address the shortcomings of the prior art by utilizing fixing as described above. The use of phase change is advantageous over previous techniques (intrinsic stressed layers) because the phase transition can induce a significant volume modification. Therefore, materials/phases with strong volume change are favorable. The choice of materials has also to be compatible with microelectronics integrations.

Figure 2:
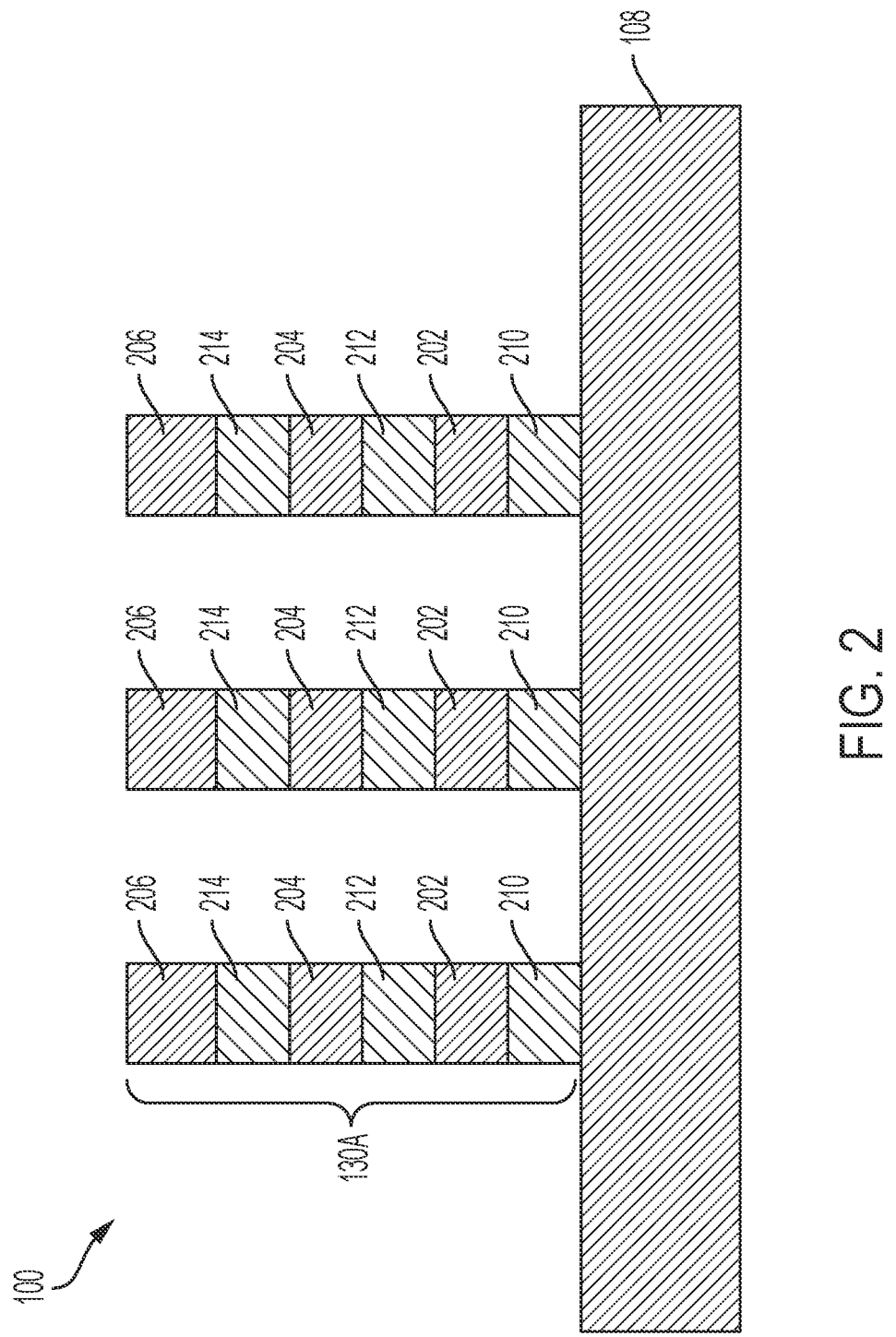
FIG. 2 depicts a cross-sectional view of a semiconductor structure after a processing operation according to one or more embodiments of the invention.
Figure 4A:
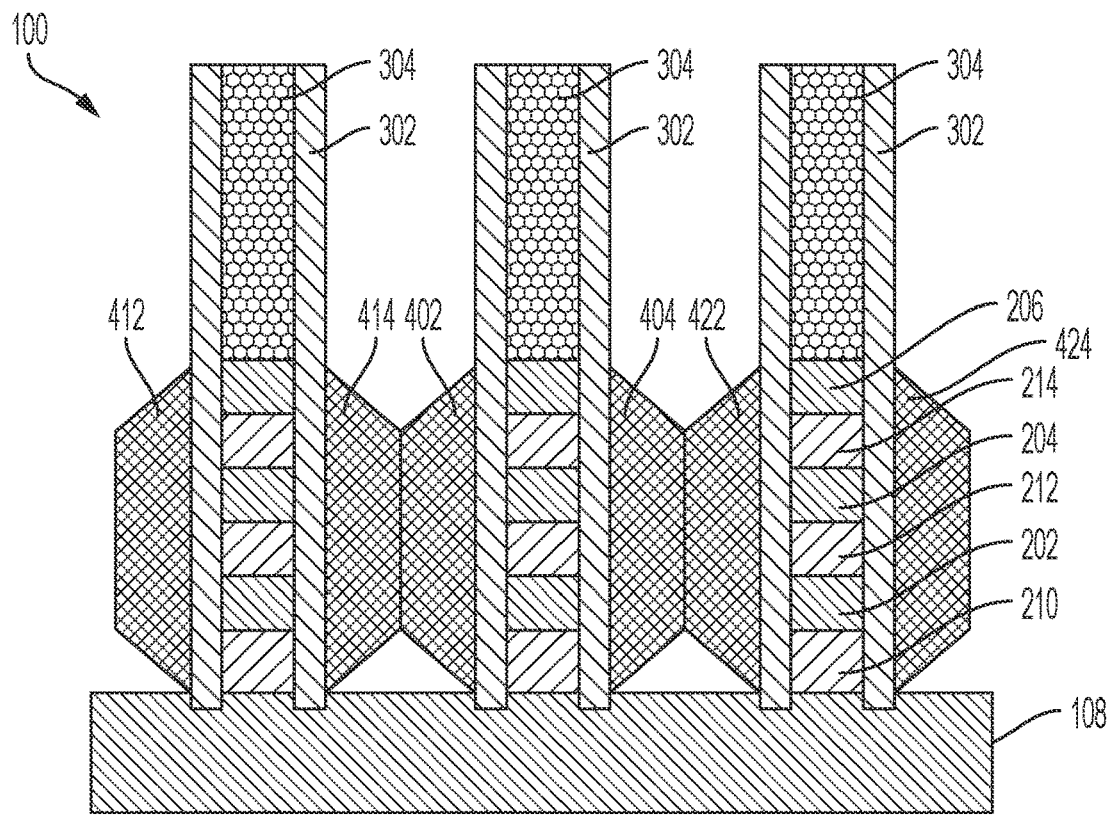
FIG. 4A depicts a cross-sectional view of a semiconductor structure after a processing operation according to one or more embodiments of the invention.
Figure 4B:
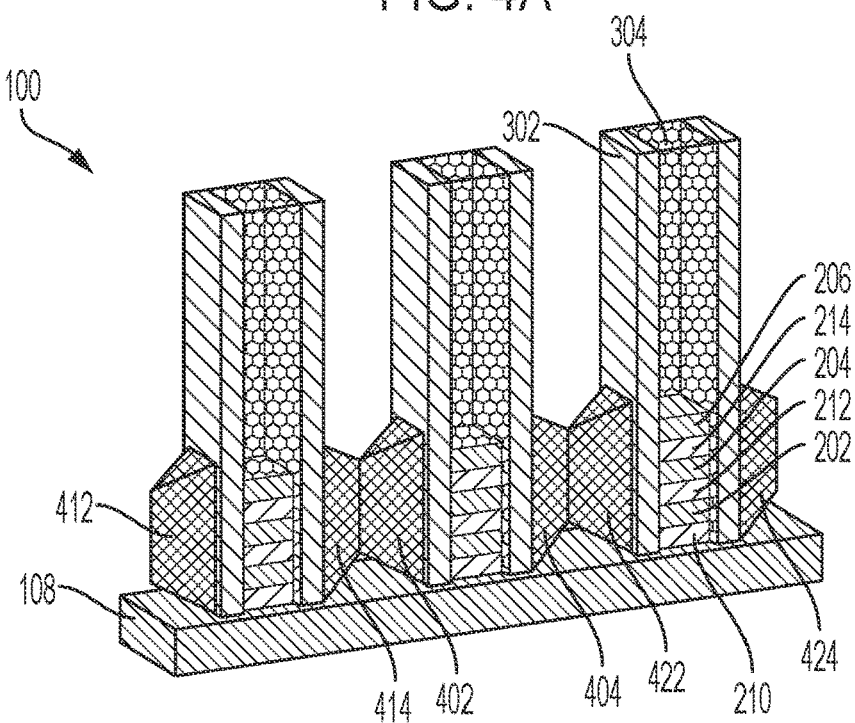
FIG. 4B depicts an alternate view of a semiconductor structure after a processing operation according to one or more embodiments of the invention.

Turning now to a more detailed description of aspects of the present invention, FIG. 1 depicts a cross-sectional view of a structure 100 having a stack 130 of alternating sacrificial nanosheet layers 110, 112, 114 and channel nanosheet layers 102, 104, 106 formed on a substrate 108 during an intermediate operation of a method of fabricating a semiconductor device according to one or more embodiments of the invention. In some embodiments of the invention, the channel nanosheet layers 102, 104, 106 and the sacrificial nanosheet layers 110, 112, 114 are epitaxially grown films. For ease of discussion reference is made to operations performed on and to nanosheet stacks having three nanosheets (e.g., nanosheets 202, 204, 206, as depicted in FIGS. 4A and 4B) alternating with three sacrificial layers (e.g., sacrificial layers 210, 212, 214, as depicted in FIG. 2). It is understood, however, that the nanosheet stack 130 can include any number of nanosheets alternating with a corresponding number of sacrificial layers. For example, the nanosheet stack 130 can include a single nanosheet, two nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets). In some embodiments of the invention, a topmost sacrificial layer is formed on a topmost nanosheet.

The channel nanosheet layers 102, 104, 106 can be made of any suitable material such as, for example, monocrystalline Si or silicon germanium (SiGe). In some embodiments of the invention, the channel nanosheet layers 102, 104, 106 are nFET nanosheets. In some embodiments of the invention, the nFET nanosheets are Si nFET nanosheets. In some embodiments of the invention, the channel nanosheet layers 102, 104, 106 have a thickness of about 4 nm to about 10 nm, although other thicknesses are within the contemplated scope of the invention. In yet other embodiments of the invention, the channel nanosheet layers 102, 104, 106 have a thickness of about 6 nm, although other thicknesses are within the contemplated scope of the invention.

The substrate 108 can be made of any suitable substrate material, such as, for example, monocrystalline Si, SiGe, SiC, III-V compound semiconductor, II-VI compound semiconductor, or semiconductor-on-insulator (SOI). In some embodiments of the invention, the substrate 108 includes a buried oxide layer (not depicted). In some embodiments of the invention, the substrate 108 includes both an nFET Region and a pFET Region. In some embodiments of the invention, the substrate 108 includes either an nFET Region or a pFET Region.

In some embodiments of the invention, the sacrificial nanosheet layers 110, 112, 114 can be Si or SiGe. In embodiments of the invention where the channel nanosheet layers 102, 104, 106 are Si nFET nanosheets the sacrificial nanosheet layers 110, 112, 114 are SiGe sacrificial layers. In some embodiments of the invention, the sacrificial nanosheet layers 110, 112, 114 have a thickness of about 4 nm to about 15 nm, although other thicknesses are within the contemplated scope of the invention. In yet other embodiments of the invention, the sacrificial nanosheet layers 110, 112, 114 have a thickness of about 10 nm.

FIG. 2 illustrates a cross-sectional view of the structure 100 after patterning the nanosheet stack 130 (shown in FIG. 1) to form nanosheets 202, 204, 206 during an intermediate operation of a method of fabricating a semiconductor device according to one or more embodiments of the invention. In this manner, the nanosheets 202, 204, 206 define parts of the nanosheet stacks 130A. Any known manner of patterning can be used, such as, for example, a sidewall image transfer (SIT) operation, a wet etch process, or a dry etch process. In some embodiments of the invention, the nanosheets 202, 204, 206 are patterned using a patterned hard mask and directional RIE. The nanosheet stack 130 is also patterned and etched form sacrificial layers 210, 212, 214 of the nanosheet stacks 130A.

In some embodiments of the invention, portions of the substrate 108 are removed to expose a surface of the substrate 108 and a shallow trench isolation (STI) can formed on the exposed surface. The STI prevents electrical current leak between adjacent semiconductor device components. Any known composition and manner of forming the STI can be utilized. The STI can be made of any suitable material, such as, for example, a silicon oxide. In some embodiments of the invention, the STI is etched via an etch back after a CMP process.

Figure 3A:
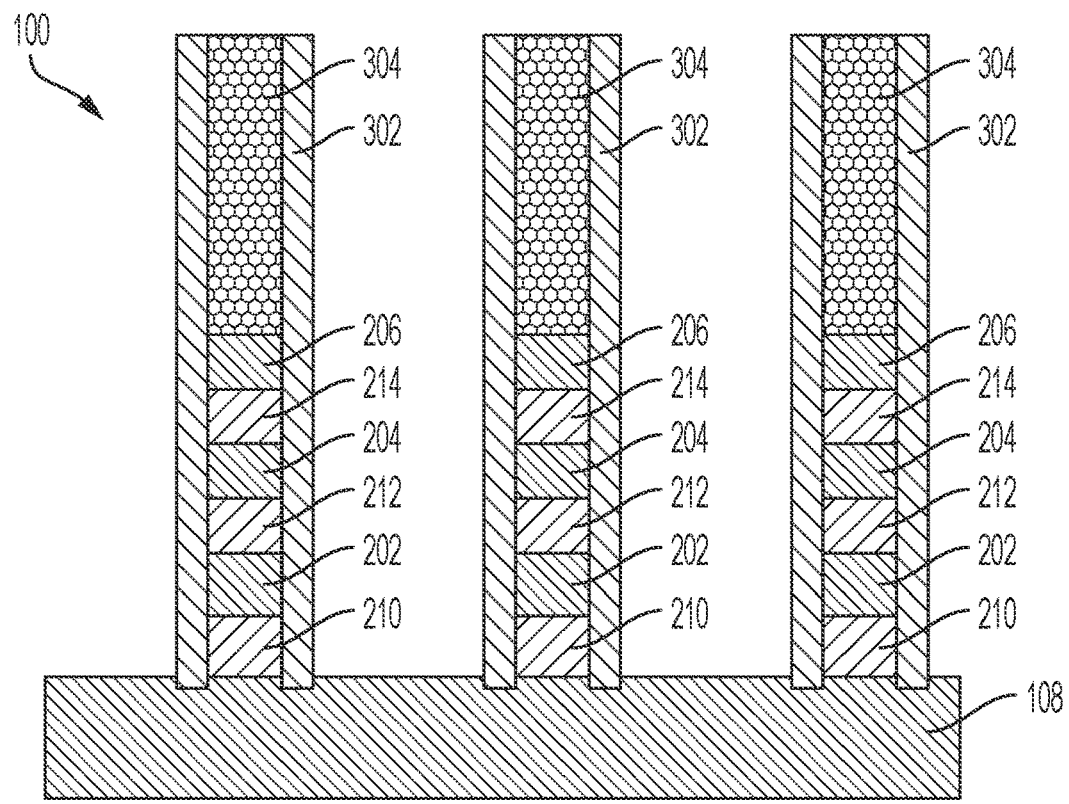
FIG. 3A depicts a cross-sectional view of a semiconductor structure after a processing operation according to one or more embodiments of the invention.

FIG. 3A illustrates a cross-sectional view of the structure 100 after forming a sacrificial gate 304 over a channel region of the nanosheet stacks 130A (i.e., nanosheets 202, 204, 206) during an intermediate operation of a method of fabricating a semiconductor device according to one or more embodiments of the invention. The sacrificial gates 304 can be made of any suitable material, such as, for example, amorphous silicon or polysilicon. Any known method for patterning a sacrificial gate (also known as a dummy gate) can be used, such as, for example, a wet etch, a dry etch, or a combination of sequential wet and/or dry etches. In some embodiments of the invention, a hard mask can be formed on the sacrificial gate 304. In some embodiments of the invention, the sacrificial gates 304 are formed by patterning the hard masks using a wet or dry etch process to selectively remove portions of the sacrificial gates 304 which are not covered by the patterned hard masks. The hard masks can be made of any suitable material, such as, for example, a silicon nitride. In some embodiments of the invention, second hard masks (not depicted) are formed on the hard masks to form a bilayer hard mask. In some embodiments of the invention, the second hard masks include an oxide, such as, for example, silicon dioxide.

Embodiments of the invention can facilitate the relaxation of compressive/tensile stress in the material that forms the sacrificial gate 302 in the nFET/pFET regions through, for example, ion bombardment, thermal annealing, or laser annealing. That is, these processes can be used to modify the strain of the sacrificial gate material which can be used to manipulate the strain in the underlying channel layer or region. The strain can be used to adapt the hole or electron mobility of the semiconductor device. Embodiments of the invention also provide for the use of a different sacrificial gate material for nMOS and pMOS regions. Further embodiments of the invention describe processing the pMOS before the epitaxial deposition of nMOS such as to fix the strain and relax the sacrificial gate from the nMOS before epitaxial deposition of the nMOS.

Spacers 302 (also known as sidewall spacers) are formed on sidewall surfaces of the sacrificial gates 302, the sacrificial layers 210, 212, 214 during an intermediate operation of a method of fabricating a semiconductor device according to one or more embodiments of the invention. In some embodiments of the invention, the spacers 302 are formed using a CVD, PECVD, ALD, PVD, chemical solution deposition, or other like processes in combination with a wet or dry etch process. The spacers 302 can be made of any suitable material, such as, for example, a low-k dielectric, a nitride, silicon nitride, silicon dioxide, SiON, SiC, SiOCN, or SiBCN. In some embodiments of the invention, portions of the first nanosheet stack (i.e., nanosheets 202, 204, 206) are removed to expose a surface of the substrate 108. Any known method for patterning nanosheet stacks can be used, such as, for example, a wet etch, a dry etch, or a combination of sequential wet and/or dry etches. In some embodiments of the invention, a directional dry etch selective to the spacers 302 is used. In this manner, opposite ends of the nanosheet stacks extend to opposite edges of the spacers 302.

Figure 3B:
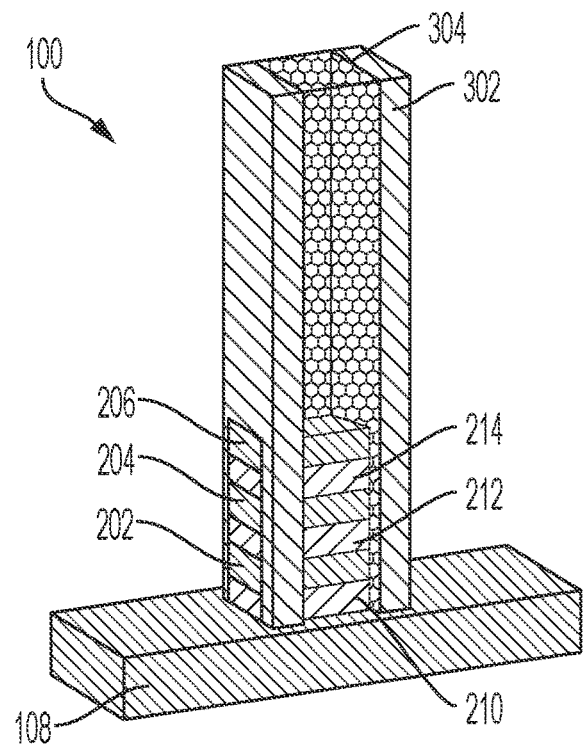
FIG. 3B depicts an alternate view of a semiconductor structure after a processing operation according to one or more embodiments of the invention.

FIG. 3B depicts an angled view of the semiconductor device 100. As shown, the nanosheets (i.e., 202, 204, 206) and sacrificial layers (i.e., 210, 212, 214) are shown exposed through the spacer 302. The exposed region provides a surface for S/D regions to be formed as discussed below.

FIG. 4A illustrates a cross-sectional view of the structure 100 after forming and merging S/D regions with neighboring nanosheet stacks. In one or more embodiments of the invention, the S/D regions are epitaxially grown on the exposed surface of the one or more layers shown in FIG. 3B. As shown in FIG. 4A, S/D regions 402 and 404 for a first nanosheet stack, S/D regions 412 and 414 for a second nanosheet stack (first neighboring nanosheet stack) and S/D regions 422 and 424 for a third nanosheet stack (second neighboring nanosheet stack) have been grown. During the growing processing, the neighboring S/D regions 412, 414, 422, and 424 become merged with the S/D regions 402 and 404 of the first nanosheet stack and thus fixing the strain that was generating during the modification of the sacrificial gate 304 described above.

Doped regions 402, 404, 412, 414, 422, 424 are formed on opposite ends of the nanosheet stacks (e.g., nanosheets 202, 204, 206). The doped regions 402, 404, 412, 414, 422, 424 can be source or drain regions formed in the substrate 108 by a variety of methods, such as, for example, in-situ doped epitaxy, doped following the epitaxy, or by implantation and plasma doping. In some embodiments of the invention, the doped regions 402, 404, 412, 414, 422, 424 are complementary, such that one of the doped regions is a source while the other is a drain. In embodiments of the invention having both nFET and pFET regions the doped regions are n-type doped regions and the doped regions are p-type doped regions. The doped regions 402, 404, 412, 414, 422, 424 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments of the invention, doped regions 402, 404, 412, 414, 422, 424 include epitaxial semiconductor materials grown from gaseous or liquid precursors. In some embodiments of the invention, epitaxial regions are epitaxially grown over the substrate 106. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium). The dopant concentration in the doped regions 402, 404, 412, 414, 422, 424 can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions 402, 404, 412, 414, 422, 424 include silicon. In some embodiments of the invention, the doped regions 402, 404, 412, 414, 422, 424 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

FIG. 4B illustrates an angled-view of the structure 100 where the S/D regions 402, 404, 412, 414, 422, 424 fixing the strain on the nanosheets 202, 204, 206 of the nanosheet stack 130. The shape of the S/D regions 402, 404, 412, 414, 422, 424 depict a pyramid-like structure extending from the exposed portions of the nanosheet stacks.

Figure 5:
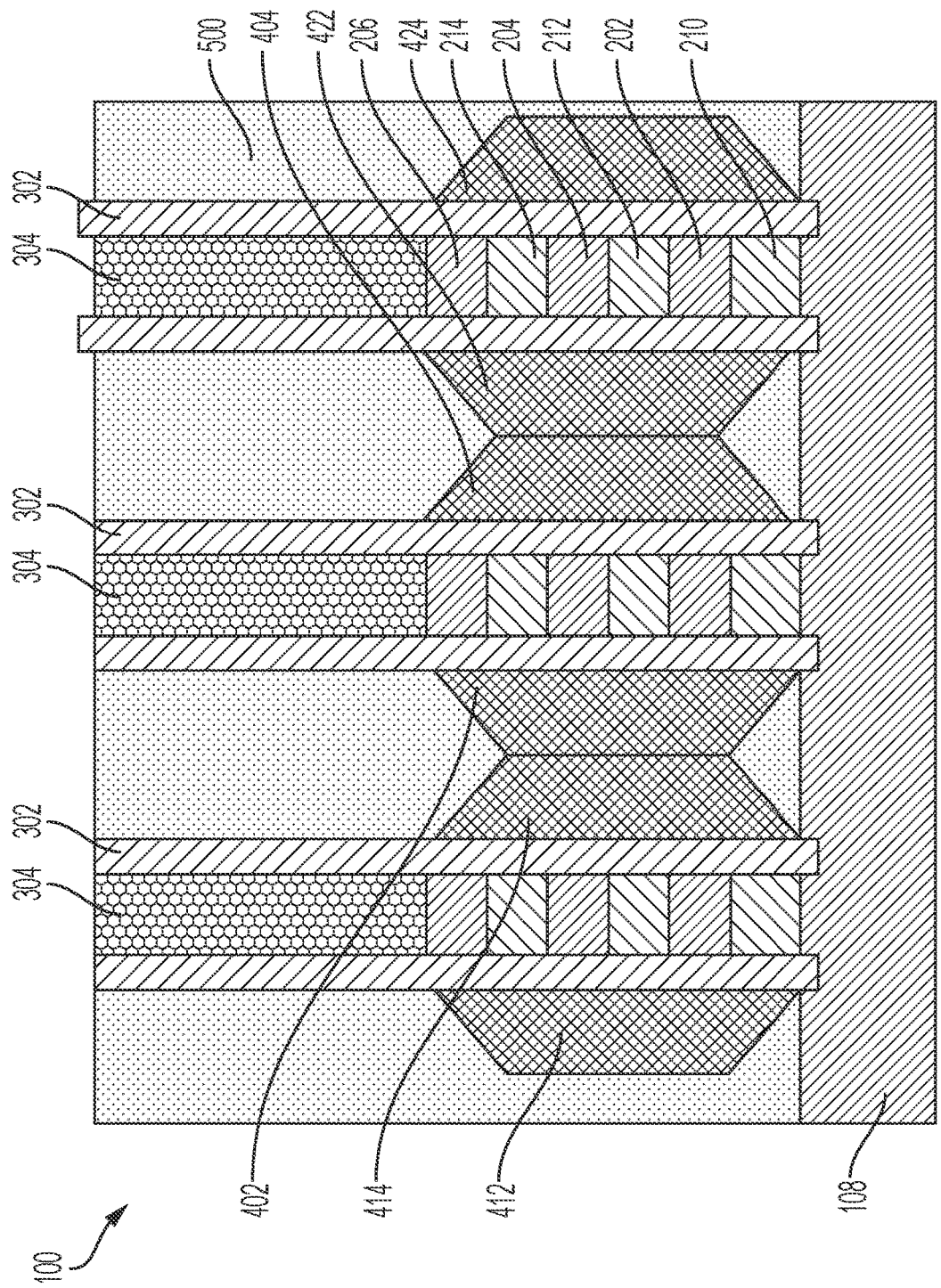
FIG. 5 depicts a cross-sectional view of a semiconductor structure after a processing operation according to one or more embodiments of the invention.

FIG. 5 illustrates a cross-sectional view of the structure 100 after forming an interlayer dielectric (ILD) 500 over the doped regions 402, 404, 412, 414, 422, 424 and sacrificial gates 304 during an intermediate operation of a method of fabricating a semiconductor device according to one or more embodiments of the invention. The ILD 500 can be made of any suitable material, such as, for example, porous silicates, carbon doped oxides, silicon dioxides, silicon nitrides, silicon oxynitrides, or other dielectric materials. Any known manner of forming the ILD 500 can be utilized. The ILD 500 can be formed using, for example, CVD, PECVD, ALD, flowable CVD, spin-on dielectrics, or PVD. In some embodiments of the invention, the ILD 500 is planarized to a top surface of the hard masks, using, for example, a CMP operation. In some embodiments of the invention, the ILD 500 includes a thin nitride cap layer (not depicted).

Figure 6:
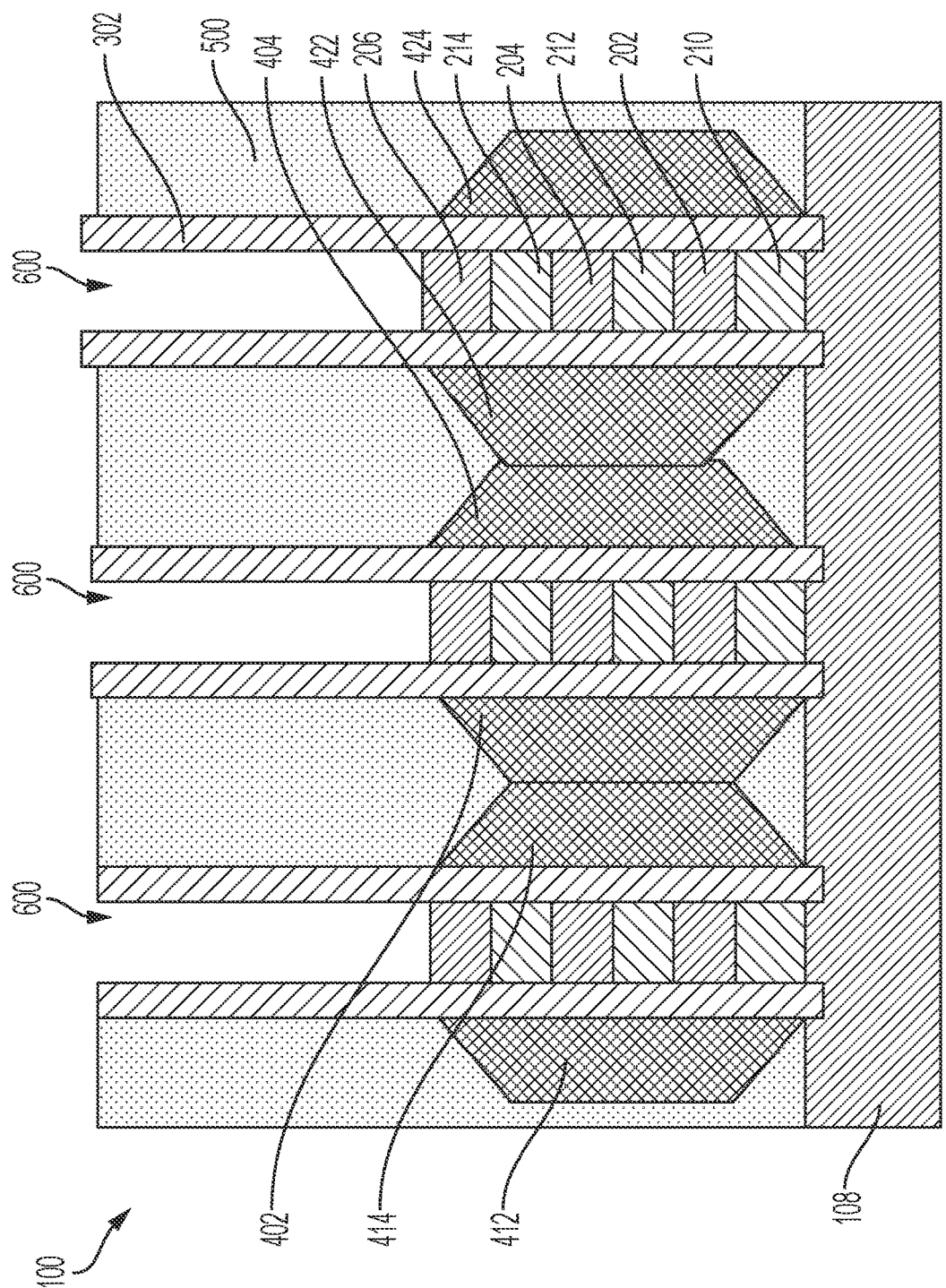
FIG. 6 depicts a cross-sectional view of a semiconductor structure after a processing operation according to one or more embodiments of the invention.

FIG. 6 illustrates a cross-sectional view of the structure 100 removing the sacrificial gates 600 during an intermediate operation of a method of fabricating a semiconductor device according to one or more embodiments. Any known method for removing the sacrificial gates 600 can be used, such as, for example, a wet etch, a dry etch, or a combination of sequential wet and/or dry etches. In some embodiments of the invention, a directional dry etch selective to the spacers 302 is used.

Figure 7:
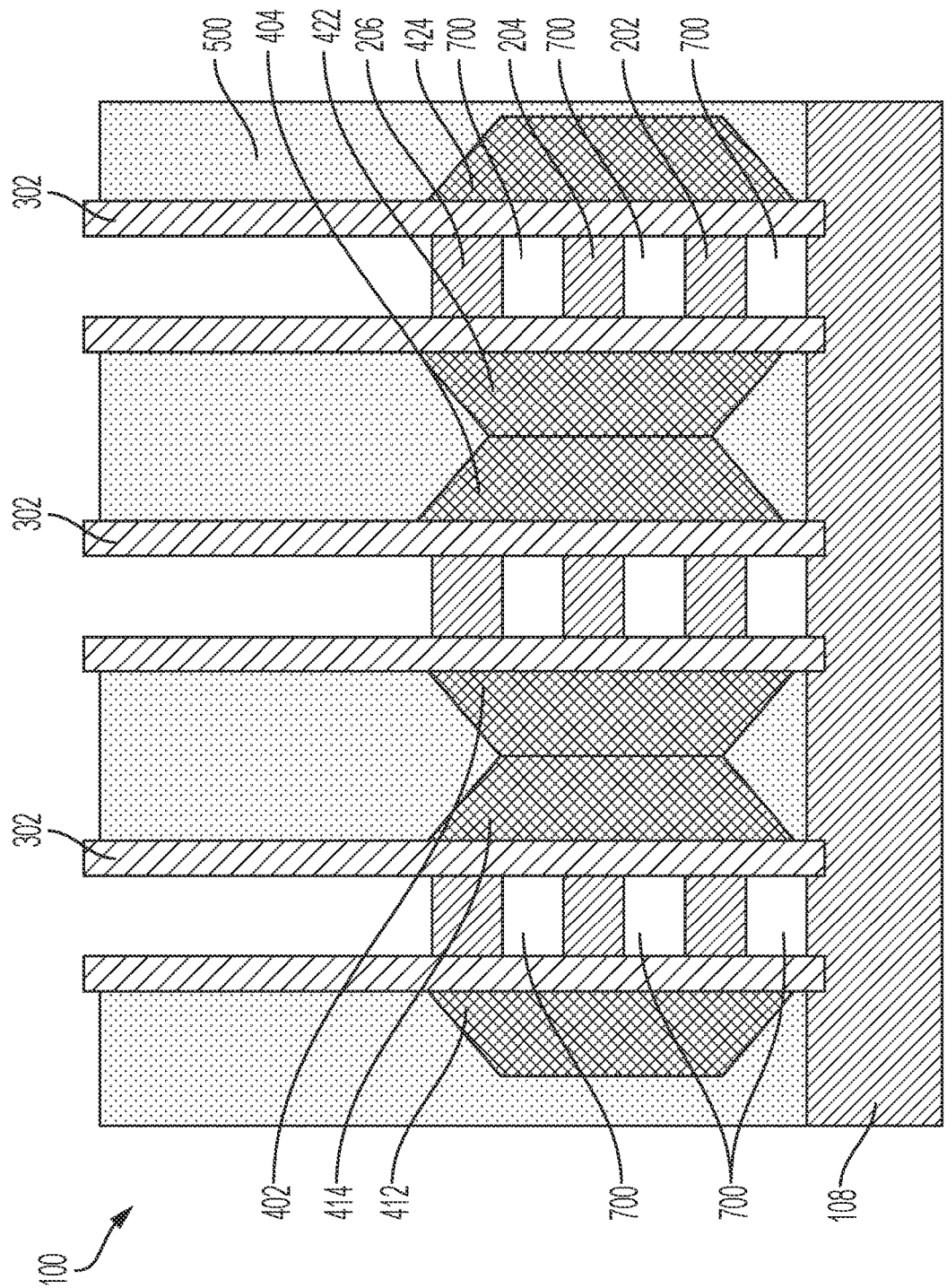
FIG. 7 depicts a cross-sectional view of a semiconductor structure after a processing operation according to one or more embodiments of the invention.

FIG. 7 illustrates a cross-sectional view of the structure 100 after removing the sacrificial layers 210, 212, 214 during an intermediate operation of a method of fabricating a semiconductor device according to one or more embodiments of the invention. As previously described herein, the sacrificial layers 210, 212, 214 are removable using the same etchant (i.e., concurrently during the same wet or dry etch). Any suitable known removal process can be utilized. In some embodiments of the invention, the sacrificial layers 210, 212, 214 are removed using a wet or dry etch process selective to the nanosheets 202, 204, 206. In some embodiments of the invention, an HCl etch is used to remove the sacrificial layers 210, 212, 214. In some embodiments of the invention, the HCl etch is a highly SiGe selective vapor phase etch at a temperature of about 300 to about 700 degrees Celsius. In some embodiments of the invention, tetramethylammnoium hydroxide (TMAH), tetraethylammnoium hydroxide (TEAH), or ammonium hydroxide ($NH_4OH$) can be used to selectively remove the sacrificial layers 210, 212, and 214.

In one or more embodiments of the invention, a thick dielectric layer can be formed over channel regions of the nanosheet stacks (i.e., the nanosheets 202, 204, 206) during an intermediate operation of a method of fabricating a semiconductor device. The thick dielectric layer can be formed using, for example, CVD, PECVD, ALD, flowable CVD, spin-on dielectrics, or PVD. In some embodiments of the invention, the thick dielectric layer is conformally formed using ALD to a thickness of about 3 nm to about 10 nm, although other thicknesses are within the contemplated scope of the invention.

Figure 8:
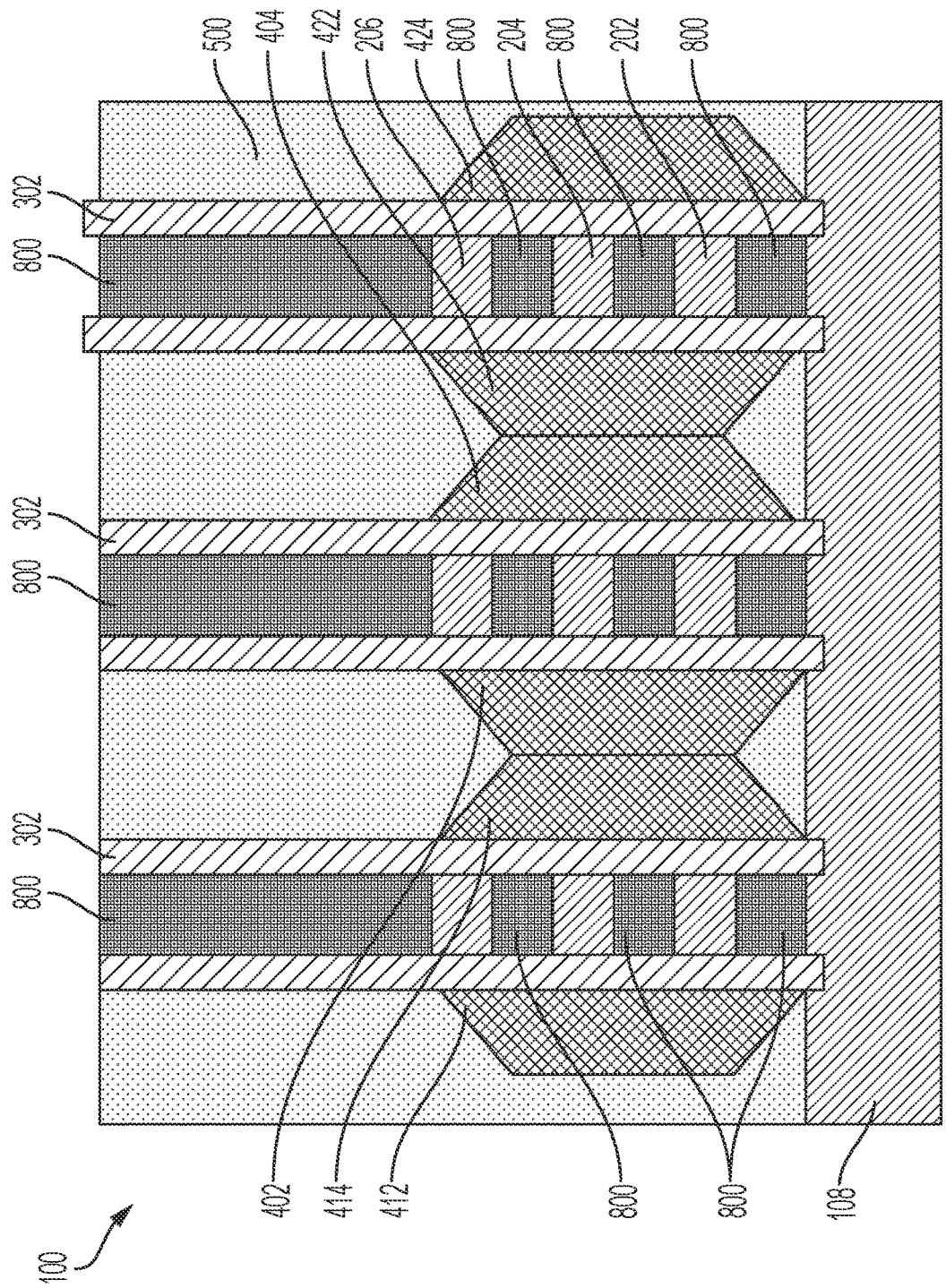
FIG. 8 depicts a cross-sectional view of a semiconductor structure after a processing operation according to one or more embodiments of the invention.

FIG. 8 illustrates a cross-sectional view of the structure 100 after forming conductive gates 800 to wrap around channel regions of the nanosheet stacks 130, respectively, during an intermediate operation of a method of fabricating a semiconductor device according to one or more embodiments of the invention. The conductive gates 800 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the conductive gates 800 are planarized to a top surface of the spacers 302, using, for example, a CMP operation.

In some embodiments of the invention, a high-k dielectric (not depicted) is formed between each of the conductive gates 800 the channel regions of the nanosheet stacks 130. In some embodiments of the invention, the high-k dielectric modifies the work function of each respective gate. The high-k dielectrics can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectrics can have a thickness of about 0.5 nm to about 4 nm. In some embodiments, the high-k dielectrics can have a thickness of about 2 nm to about 3 nm, although other thicknesses are within the contemplated scope of the invention.

In some embodiments of the invention, work function layers (not depicted) are formed between each of the high-k dielectrics and the conductive gates 800. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments of the invention, the work function layers further modify the work function of each respective gate.

Figure 9:
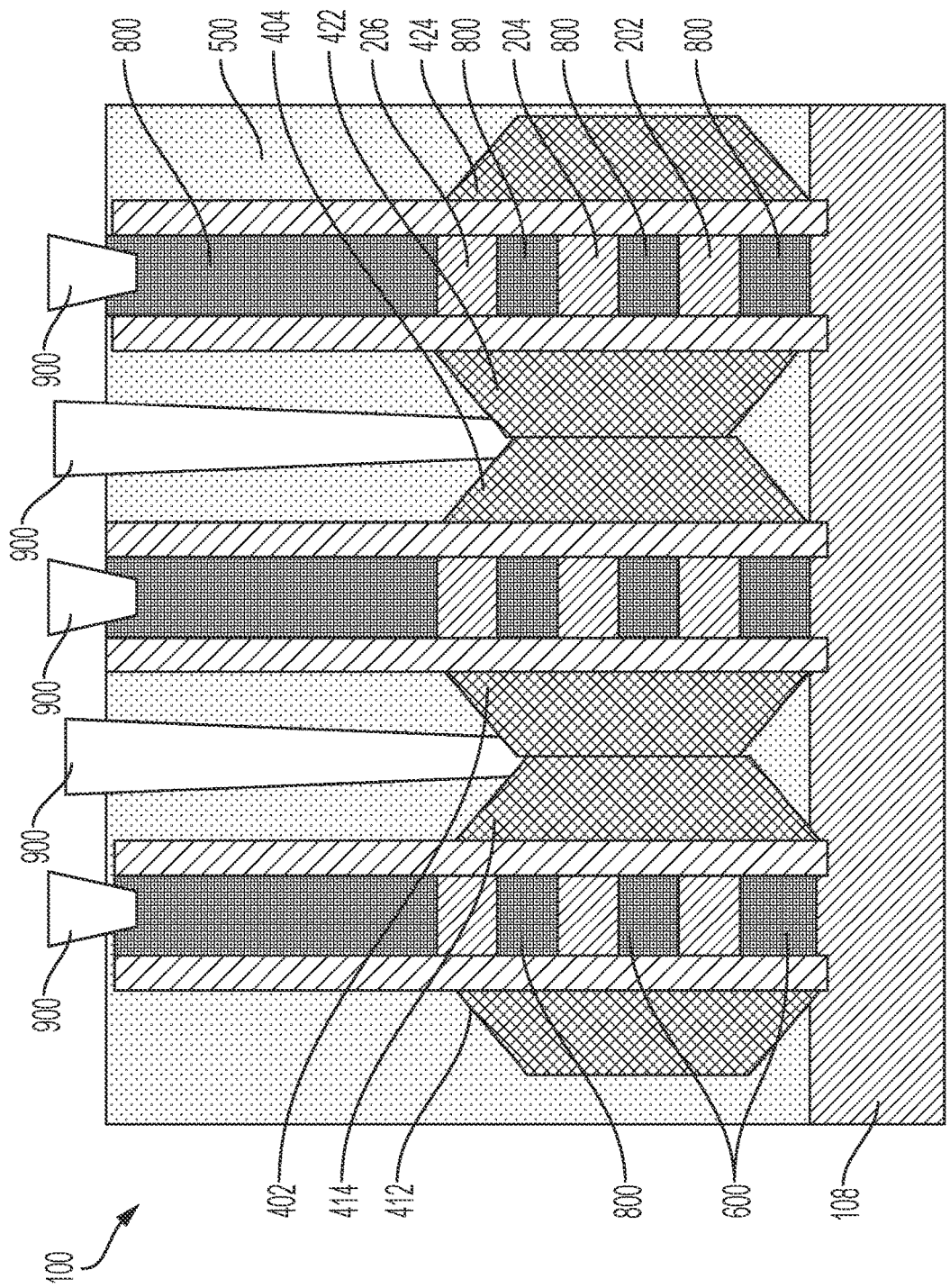
FIG. 9 depicts a cross-sectional view of a semiconductor structure after a processing operation according to one or more embodiments of the invention.

FIG. 9 illustrates a cross-sectional view of the structure 100 after expanding the ILD 500 above a surface of the conductive gates 800 and forming contacts 900 in the ILD 500 during an intermediate operation of a method of fabricating a semiconductor device according to one or more embodiment of the invention. The contacts 900 can be formed using known metallization techniques. In some embodiments of the invention, the ILD 500 is extended with additional material, patterned with open trenches, and the contacts 900 are deposited into the trenches. In some embodiments of the invention, the contacts 900 are overfilled into the trenches, forming overburdens above a surface of the ILD 500. In some embodiments of the invention, a CMP selective to the ILD 500 removes the overburden.

The contacts 900 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the contacts 900 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 10:
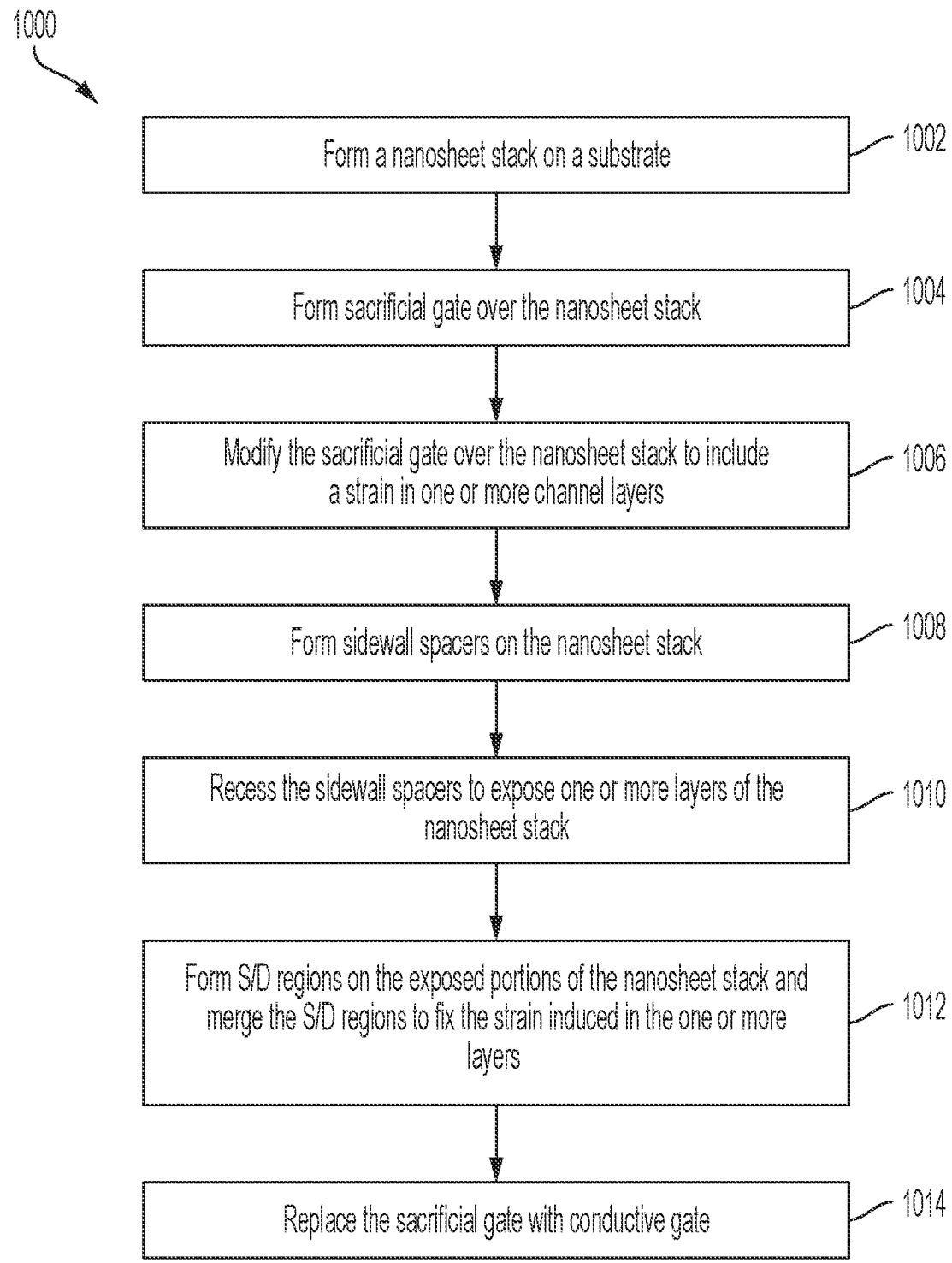
FIG. 10 depicts a flow diagram illustrating a method according to one or more embodiments of the invention.

FIG. 10 depicts a flow diagram 1000 illustrating a method for forming a semiconductor device according to one or more embodiments of the invention. As shown in block 1002, a nanosheet is formed over a substrate and at block 1004, a sacrificial gate is formed over the nanosheet stack. At block 1006, the sacrificial gate formed over the nanosheet stack is modified to incudes a strain in one or more layers of the nanosheet stack.

At block 1008, sidewall spacers are formed on the nanosheet stack. At block 1010, the sidewall spacers are recessed to expose one or more layers of the nanosheet stack. In one or more embodiments of the invention, recessing a portion of the sidewall exposes one or more layers of the nanosheet stack to form a S/D region.

At block 1012, the S/D regions are formed on the exposed portions of the nanosheet stack and merged with S/D regions of neighboring nanosheet stacks to fix the strain induced in the one or more layers. In one or more embodiments of the invention, the S/D regions are epitaxially grown and make contact with an S/D region of a neighboring nanosheet stack thus fixing the strain of the channel regions. At block 1014, the sacrificial gate is replaced by a conductive gate without losing or impacting the strain that was previously generated in the channel.

Figure 11:
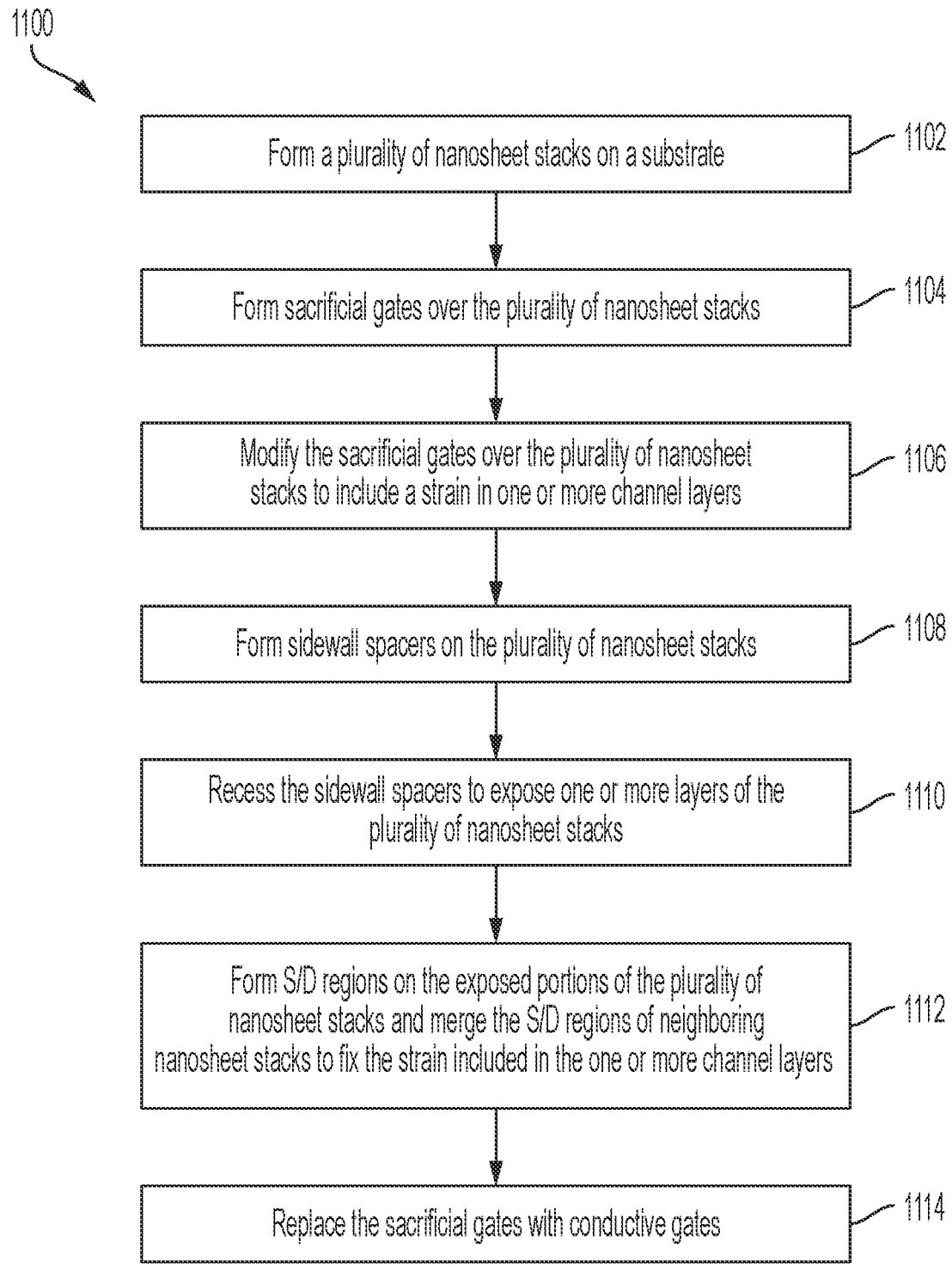
FIG. 11 depicts a flow diagram illustrating a method according to one or more embodiments of the invention.

FIG. 11 depicts a flow diagram 1100 illustrating a method for forming a semiconductor device according to one or more embodiments of the invention. As shown at block 1102, a plurality of nanosheet stacks is formed over a substrate. A center nanosheet stack can have a first neighboring nanosheet stack and a second neighboring nanosheet stack on the opposite side.

At block 1104, sacrificial gates are formed over the plurality of nanosheet stacks. At block 1106, the sacrificial gates formed over the plurality of nanosheet stacks are modified to induce strain in one or more layers of the plurality of nanosheet stacks. The modification can include performing thermal annealing At block 1108, sidewall spacers are formed on the plurality of nanosheet stacks. At block 1110, the sidewall spacers are removed to expose one or more layers of the plurality of nanosheet stacks. At block 1112, S/D regions are formed on the exposed portions of the plurality of nanosheet stacks and merged with the S/D regions of neighboring nanosheet stacks to fix the strained induced in the one or more layers. At block 1114, the sacrificial gates are replaced with conductive gates without impacting the strain induced in the one or more layers.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The phrase "direct contact" means that a first element, such as a first structure, and a second element, such as a second structure, are connected without any intermediary conducting, insulating or semiconductor layers at the interface of the two elements. It should be noted that the phrase "selective to," such as, for example, "a first element selective to a second element," means that a first element can be etched and the second element can act as an etch stop. The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    a nanosheet stack comprising one or more layers, wherein channel regions of the one or more layers comprise one of tensile strained and compressive strained semiconductive material resulting from a phase transition of a modified sacrificial gate;
    one or more merged S/D regions comprising a pyramidal structure on exposed portions of the nanosheet stack exposed through a gate spacer on sidewalls of the modified sacrificial gate, wherein a first portion of the one or more merged S/D regions is epitaxially grown from the exposed portions of the nanosheet stack and a second portion of the one or more merged S/D regions is epitaxially grown from an exposed portion of a second nanosheet stack, the first portion and the second portion epitaxially grown and merged prior to removing the modified sacrificial gate to fix the strain in the one or more layers; and
    a conductive gate formed over the nanosheet stack, wherein the conductive gate replaces the modified sacrificial gate after forming the one or more merged S/D regions.

2. The semiconductor device of claim 1, wherein the one or more merged S/D regions are formed on an exposed portions of one or more layers of the nanosheet stack.

3. The semiconductor device of claim 1, wherein the merged S/D regions comprises a first S/D region of the nanosheet stack that merges with a S/D region of a first neighboring nanosheet stack on a first side of the nanosheet stack, and a second S/D region merges with a S/D region of a second neighboring nanosheet stack on a second side of the nanosheet stack.

4. The semiconductor device of claim 1 further comprising a dielectric layer formed over the one or more layers of the nanosheet stack.

5. The semiconductor device of claim 4 further comprising the conductive gate formed over the dielectric layer on the one or more layers of the nanosheet stack.

6. The semiconductor device of claim 5 further comprising one or more contacts formed and coupled to the one or more S/D regions.

\* \* \* \* \*